US006822878B2

(12) United States Patent
Dobbs et al.

(10) Patent No.: US 6,822,878 B2
(45) Date of Patent: Nov. 23, 2004

(54) CIRCUIT BOARD SUPPORT ARRANGEMENT, METHOD, AND METHOD FOR USING THE SAME

(75) Inventors: Robert W. Dobbs, Granite Bay, CA (US); James K. Koch, Rocklin, CA (US); Thane M. Larson, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 49 days.

(21) Appl. No.: 10/267,768

(22) Filed: Oct. 9, 2002

(65) Prior Publication Data

US 2004/0070955 A1 Apr. 15, 2004

(51) Int. Cl.[7] .............................. H05K 1/14; H05K 7/16
(52) U.S. Cl. ....................... 361/807; 361/758; 361/796; 361/752
(58) Field of Search ................................ 361/758, 742, 361/770, 767, 804, 807, 752

(56) References Cited

U.S. PATENT DOCUMENTS

| 2,740,097 | A | | 3/1956 | Edelman et al. |
| 3,701,071 | A | * | 10/1972 | Landman ........................ 339/4 |
| 4,058,890 | A | | 11/1977 | Pierce et al. |
| 4,527,312 | A | * | 7/1985 | Ruehl et al. ................... 24/453 |
| 4,678,252 | A | * | 7/1987 | Moore ........................... 439/62 |
| 4,742,183 | A | | 5/1988 | Soloway et al. |
| 4,863,388 | A | * | 9/1989 | Reimer et al. ................ 439/31 |
| 5,268,820 | A | * | 12/1993 | Tseng et al. ................. 361/785 |
| 5,337,220 | A | * | 8/1994 | Granitz ....................... 361/816 |
| 5,373,149 | A | | 12/1994 | Rasmussen |
| 6,049,467 | A | * | 4/2000 | Tamarkin et al. ........... 361/790 |
| 6,128,196 | A | | 10/2000 | Hoyle, Jr. et al. |
| 6,200,144 | B1 | * | 3/2001 | Wark ........................... 439/74 |
| 6,234,820 | B1 | * | 5/2001 | Perino et al. ................ 439/326 |
| 6,270,369 | B1 | * | 8/2001 | Kato et al. ................... 439/326 |
| 6,282,099 | B1 | | 8/2001 | Wilson et al. |
| 6,385,055 | B1 | | 5/2002 | Kramer et al. |
| 6,392,875 | B1 | | 5/2002 | Erickson et al. |
| 6,570,775 | B2 | * | 5/2003 | Lai ............................. 361/801 |
| 2002/0135993 | A1 | | 9/2002 | Ueyama et al. |

FOREIGN PATENT DOCUMENTS

| DE | 4123407 | 1/1993 |
| DE | 19721057 | 11/1998 |
| EP | 0891124 | 3/2000 |
| JP | 05113835 | 5/1993 |
| JP | 08139474 | 5/1996 |
| JP | 08236895 | 9/1996 |

OTHER PUBLICATIONS

United Kingdom Search Report, Application No. GB 0322290.8, dated Nov. 21, 2003.

* cited by examiner

*Primary Examiner*—David Martin
*Assistant Examiner*—Dameon E. Levi

(57) ABSTRACT

Various embodiments of a circuit board support arrangement and associated methods are provided that facilitate hot plug access to circuit components in a server, computer system or other device. A circuit board support arrangement comprises a first circuit board and a second circuit board that is attached to a pivot joint. The second circuit board is juxtaposed over and pivotal relative to the first circuit board, and, an electronic coupling is attached between the first circuit board and the second circuit board.

16 Claims, 5 Drawing Sheets

CIRCUIT BOARD SUPPORT ARRANGEMENT, METHOD, AND METHOD FOR USING THE SAME

BACKGROUND

More and more entities such as companies or other organizations are making services and products available through the Internet or other networks. This often means employing servers that "serve up" web pages or other Internet/network content that provide user interfaces, for example, that allow a user to manipulate an Internet application or other application, etc.

In order to provide such reliable online services, providers require server reliability and low cost operation. Unfortunately, when a circuit component in a server malfunctions, it often means that the server must be powered down in order to replace the circuit component to fix the problem. This often requires extra time for disassembly and assembly of the server to gain access to the service area. In addition, servers and other computer devices are continually made smaller with more and more circuitry condensed into smaller housings so as to result in smaller footprints, thereby using less space during operation. The shrinking sizes of servers and other devices can create problems for service access. For example, access to both sides of a live circuit board may be difficult to achieve in a dense circuit environment. As a consequence, high-availability and simultaneous serviceability to a server can be problematic.

SUMMARY

One embodiment of the invention may include a circuit board support arrangement comprising a first circuit board that is attached to a support structure and a second circuit board that is attached to the support structure with a pivot joint. The second circuit board is juxtaposed over the first circuit board, and, an electronic coupling is attached between the first circuit board and the second circuit board. The electronic coupling is compatible with the pivot joint.

Another embodiment of the present invention may include a circuit board support arrangement that comprises a first circuit board attached to a support structure and a second circuit board juxtaposed over the first circuit board. In addition, a pivot means is provided for attaching a first end of the second circuit board to the support structure. Also, the circuit board support arrangement includes a means for facilitating electronic communications between a first circuit mounted on the first circuit board and a second circuit mounted on the second circuit board.

In yet another embodiment, a circuit board support method is provided. In this respect, the circuit board support method comprises mounting a second circuit board in a pivotal relationship with a first circuit board, and, electrically coupling a first circuit mounted on the first circuit board with a second circuit mounted on the second circuit board.

In still another embodiment, the present invention may comprise a method of replacing a circuit component in a circuit in a circuit board support arrangement having a first circuit board and a second circuit board. This method includes unfastening a free end of the second circuit board, pivoting the second circuit board about a pivot joint away from the first circuit board, replacing a circuit component, and, fastening the free end of the second circuit board.

DETAILED DESCRIPTION

Figure 1:
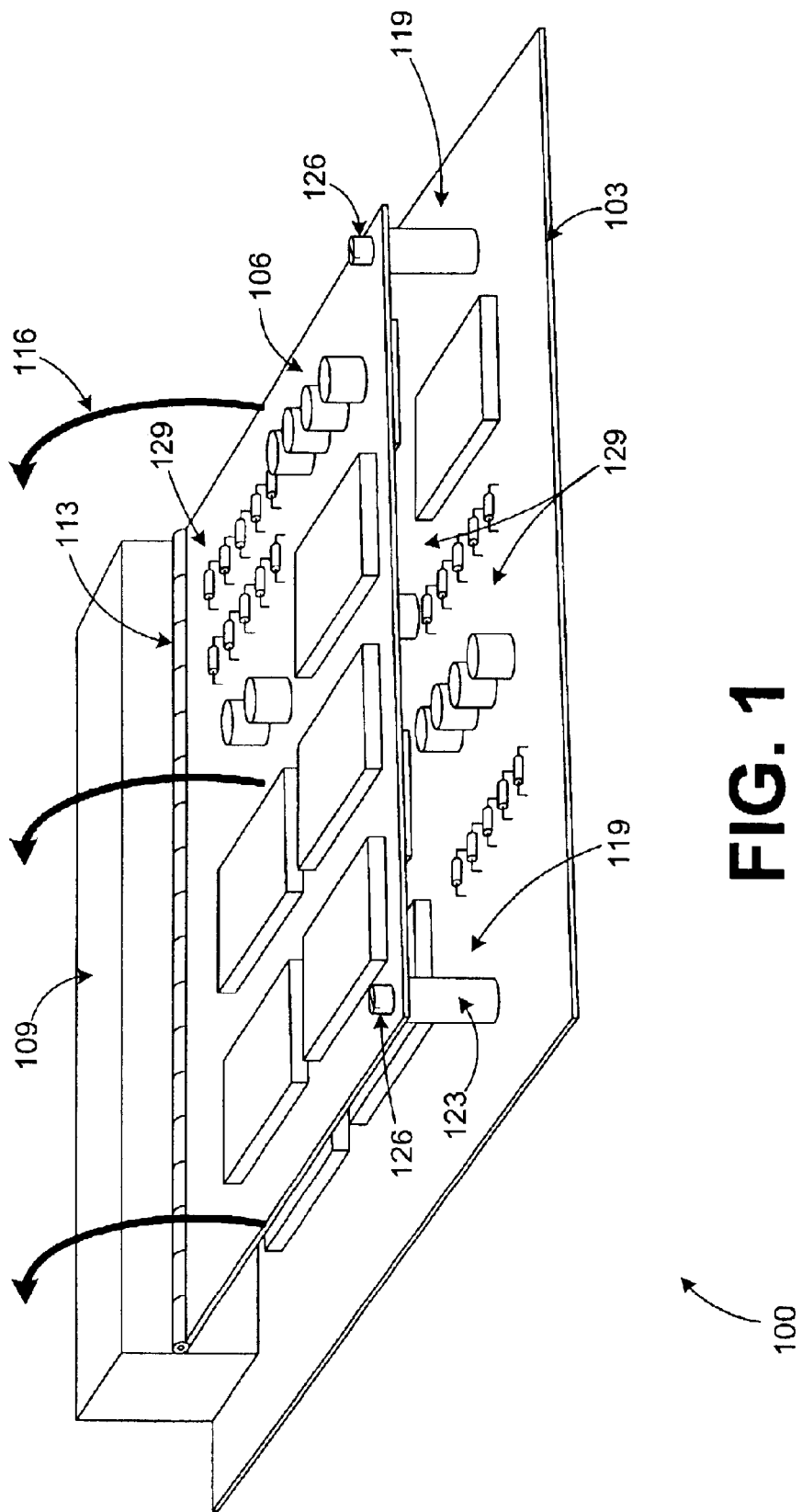
FIG. 1 is a drawing of a circuit board arrangement according to an embodiment of the present invention.

With reference to FIG. 1, shown is a drawing of a circuit board support arrangement 100 according to an embodiment of the present invention. Alternatively, the drawing of FIG. 1 may be viewed as depicting various steps of a method employed to support circuit boards in device such as a computer system, server, or other device.

In this respect, the circuit board support arrangement 100 comprises a first circuit board 103 and a second circuit board 106. The second circuit board 106 is juxtaposed over the first circuit board 103. In this regard, the first and second circuit boards 103 and 106 may or may not be parallel to each other. In any event, due to the relative positions of the first and second circuit boards 103 and 106, service access to both sides of the first and second circuit boards 103 and 106 is difficult, if not impossible while the first and second circuit boards 103 and 106 are positioned relative to each other as shown. Specifically, the upper side of the first circuit board 103 and the underside of the second circuit board 106 face each other and are positioned relatively close creating a gap in between each other that severely limits service access. According to various embodiments of the present invention, the circuit board support arrangement 100 advantageously provides for hot service access to the circuitry mounted on various sides of the first and second circuit boards 103 and 106 by providing for the pivoting of the second circuit board 106 as will be described.

The circuit board support arrangement 100 also includes a support structure 109. The support structure 109 may be, for example, a chassis or other such structural component(s). In this respect, the support structure 109 may comprise multiple structural components that are coupled or connected together as an appreciated by those with ordinary skill in the art.

The second circuit board 106 includes one end that is attached to the support structure 109 with a pivot joint 113. The pivot joint 113 may be, for example, one or more hinges, flexible material employed as a hinge, a wire braid that is used as a hinge, hinge standoffs, custom mechanical parts forming the pivot joint 113, or other appropriate pivot device. Various hinges that may be employed include, for example, standard hinges, piano hinges, or other types of hinges. The pivot joint 113 allows a free end of the second circuit board 106 to pivot about the end attached to the support structure 109 in a pivoting motion 116 when the free end of the second circuit board 106 is lifted. In addition, the hinge or other device employed at the pivot joint 113 may be releasable, thereby providing for separation between the second circuit board 106 and the support structure 109 at the pivot joint 113 if desired.

The circuit board support arrangement 100 further includes a board support 119 that holds the free end of the second circuit board 106 in the juxtaposed relationship with the first circuit board 103. In this respect, the board support 119 may comprise, for example, one or more spacers 123 or other structural component. Alternatively, the board support 119 may also comprise the support structure 109 as will be discussed with reference to later Figures. In any event, the board support 119 operates to hold the free end of the second circuit board 106 so that the second circuit board 106 does not pivot freely about the pivot joint 113, thereby coming into contact with other objects or components that may be nearby in the apparatus within which the circuit board support arrangement 100 is located.

The second circuit board 106 is held to the board support 109 with one more fasteners 126. In this respect, the second circuit board 106 is detachably fastened the board support 119. Given that one may desire to detach the free end of the second circuit board 106 while the circuits contained within the first and second circuit boards 103 and 106 are operating, the fasteners 126 may be, for example, "Captive" fasteners in that they are attached to the second circuit board 106 at all times. In this respect, when the fasteners 126 are released from the board support 119, thereby decoupling the free end of the second circuit board 106 from the board support 119, the fasteners 126 are still retained on the second circuit board 106. This prevents the fasteners 126 from accidentally being dropped onto electrically live components of the first circuit board 103, the second circuit board 126, or other electrically live/operational devices that may be positioned nearby. In this respect, hot servicing of any circuit components within the circuit board support arrangement 100 may be performed without danger of accidentally shorting out any live electrical component. The fasteners 126 may be, for example, screws, bolts, buckles, latches, snaps, clamps, custom captive fasteners, combination locking retaining clips/bolts, combination fiber washers/bolts, combination o-rings/bolts, retaining hardware that is held captive onto the board support 119, lock pins, or other fasteners. Also, the fasteners 126 may be constructed out of a non-conductive material, thereby eliminating any possibility that such fasteners 126 would short out any live electrical components if accidentally released. Such may be the case, where non-captive fasteners 126 are employed, however, non-conductive captive fasteners may also be employed.

The first circuit board 103 and the second circuit board of 106 each include one or more circuits that are each made up of one or more circuit components 129. In this respect, the circuit components 129 may comprise, for example, resistors, capacitors, integrated circuits, filters, active components, and other circuit components as can be appreciated by those with ordinary skill in the art. The circuit components 129 are mounted on both sides of the second circuit board 106 and may be mounted on both sides of the first circuit board 103. Service access is provided to the circuit components 129 that are mounted on the side of the first circuit board 103 that is opposite the second circuit board 106 by releasing the free end of the second circuit board 106 and pivoting the second circuit board 106 so as to reveal the side of the first circuit board 103. Likewise, service access is provided to the underside of the second circuit board 106 when it is pivoted accordingly.

The circuit components 129 mounted on the first and second circuit boards 103 and 106 may include field replaceable units (FRUs) that can be removed and replaced during hot servicing of the apparatus such as, for example, a server or computer system of which the circuit board support arrangement 100 is a part.

In addition, the pivot joint 113 may be constructed to predefined tolerances so as to prevent unwanted movement or vibration in the second circuit board 106. In this respect, the pivot joint 113 may be constructed with tolerances of approximately 0.01 inches or other appropriate tolerances, such tolerances being design specific depending upon the degree of rigidity desired for the second circuit board. In addition, the pivot joint 113 includes a weight bearing capacity that is at least as great as a weight of the second circuit board 106. In this respect, the weight bearing capacity of the pivot joint 113 ensures that unwanted movement or vibration of the second circuit board 106 is minimized. Also, the probability that the pivot joint 113 may fail is minimized by design when the circuit board support arrangement 100 is subjected to rough physical treatment such as during shipping, etc.

Figure 2:
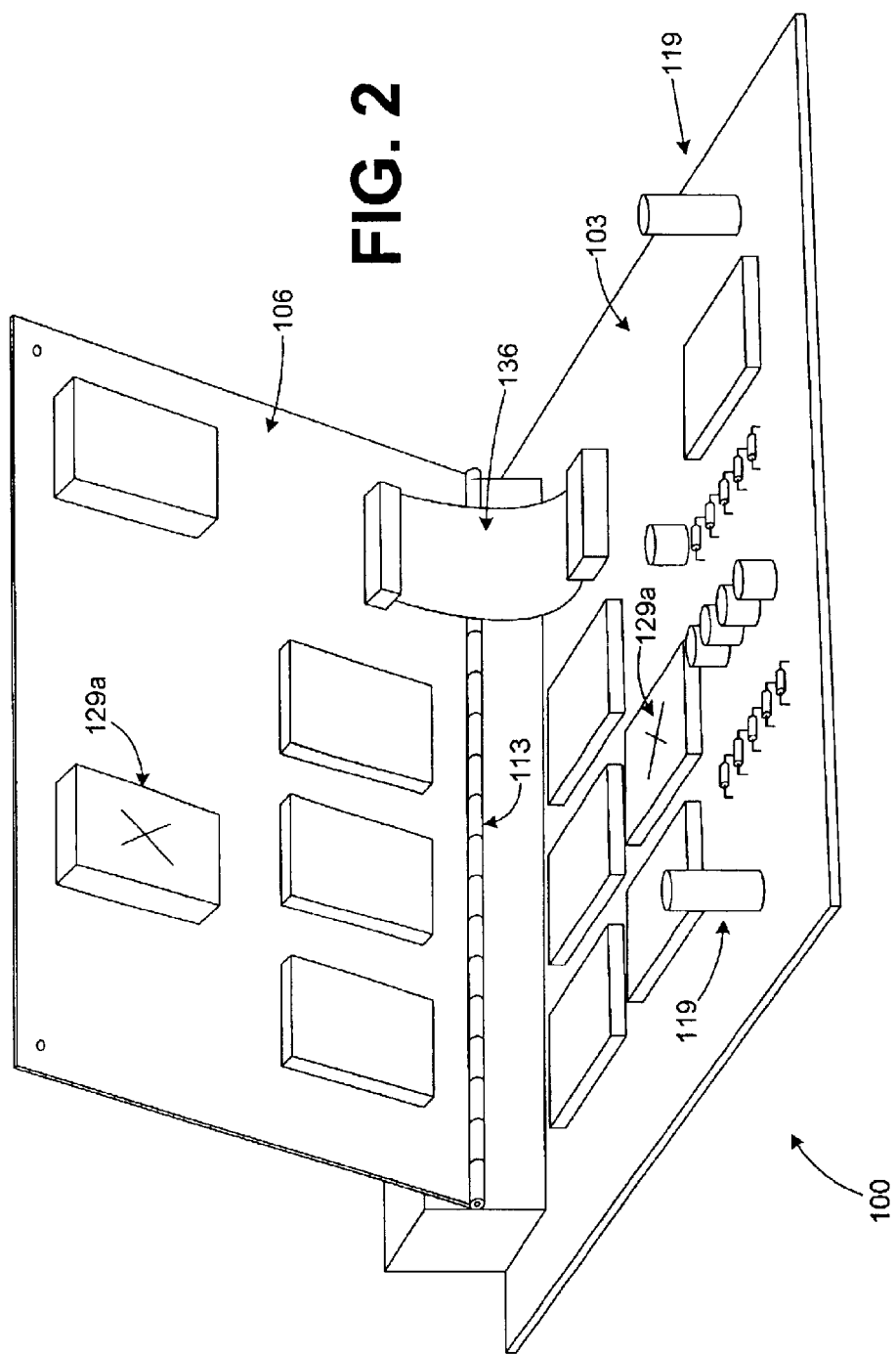
FIG. 2 is a drawing of the circuit board arrangement of FIG. 1 with a circuit board pivoted in an upward position.

Referring next to FIG. 2, shown is a further view of the circuit board support arrangement 100 according to an embodiment of the present invention. As shown, the free end of the second circuit board 106 is detached from the board support 119, thereby revealing the circuit components 129 on the underside of the second circuit board 106 and on the upper side of the first circuit board 103. As shown, the circuit components 129 include one or more field replaceable units 129a. The field replaceable units 129a are replaceable even though the electrical circuits contained on the first and second circuit boards 103 and 106 are live and/or operational. In this respect, as contemplated herein, circuitry is "live" or "operational" when power is applied thereto and the circuitry is functioning as intended.

The circuit board support arrangement 100 also includes an electronic coupling 136 between the first circuit board 103 and the second circuit board 106. The electronic coupling 136 is compatible with the pivot joint 113 in that it allows the pivoting motion 116 to occur while at the same time maintaining the electrical connection between the first and second circuit boards 103 and 106. The electronic coupling 136 may comprise, for example, a flexible cable or any other type of electrical coupling. If the electronic coupling 136 is a flexible cable, then it may include multi-conductor cables such as a ribbon cable or other type of flexible cable as can be appreciated by those with ordinary skill in the art. The electronic coupling 136 is designed for durability to allow repeated pivoting of the second circuit board 106 without undue degradation or premature failure of the electrical connection.

Figure 3A:
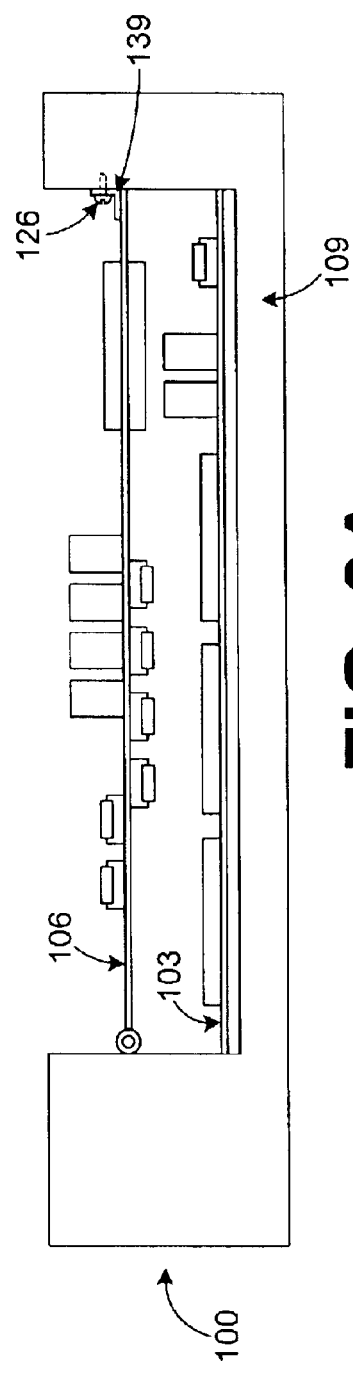
FIGS. 3A and 3B are drawings of side views of the circuit board support arrangement of FIG. 1 that depicting a pivoting circuit board fastened to a support structure using a bracket.

With reference to FIG. 3A, shown is a side view of the circuit board support arrangement 100 according to an embodiment of the present invention. In this respect, the side view of the circuit board support arrangement 100 illustrates one embodiment of the coupling between the free end of the second circuit board 106 and the support structure 109. In this example, the fastener 126 is a screw that detachably fastens a bracket to the support structure 109. The support structure 109 is also attached to the second circuit board 106. In this respect, the support structure 109 acts as the board support 119. The fastener 126 may be captive or non-captive and it also may be conductive or non-conductive.

Figure 3B:
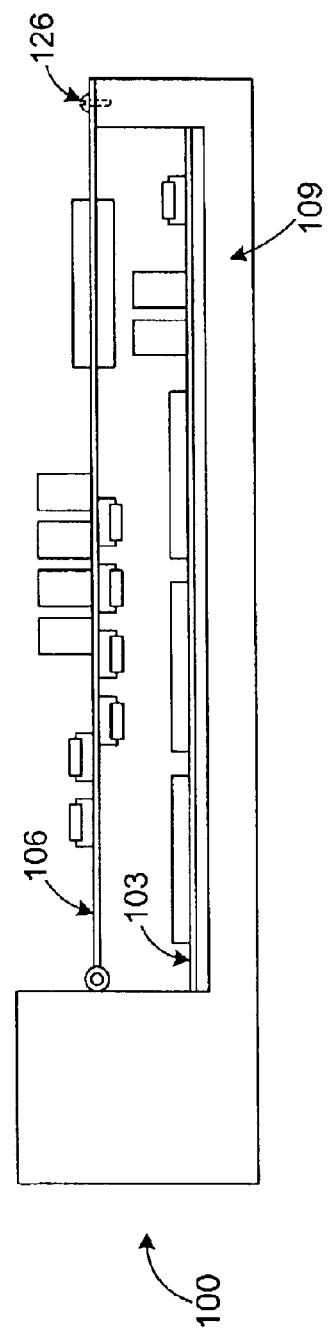

Referring next to FIG. 3B, shown is a second side view of the circuit board support arrangement 100 according to another embodiment of the present invention. In this embodiment, the support structure 109 also operates as the board support 119. Specifically, a fastener 126 such as a screw directly fastens the second circuit board 106 to the support structure 109. It is understood that fasteners 126 and/or fastening devices may be employed other than a screw as described with reference to FIGS. 3A and 3B.

Turning then to FIGS. 4A-4H, shown are a number of steps of a method of replacing a circuit component in the circuit board support arrangement 100 of FIG. 1. The present method is performed while maintaining the circuits on the first and second circuit boards 103 and 106 in an operational state with power applied thereto. In this sense, the present method describes a hot service access and servicing of circuit components 129.

Figure 4A:
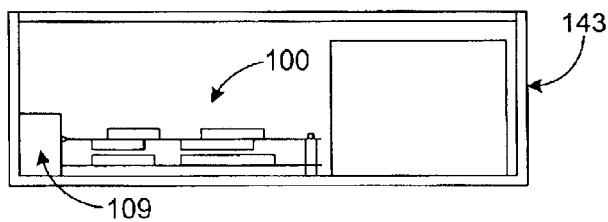
FIGS. 4A-4H are drawings depicting a number of steps of a method of performing a hot replacement of a circuit component on a circuit board in the circuit board support arrangement of FIG. 1.
Figure 4B:
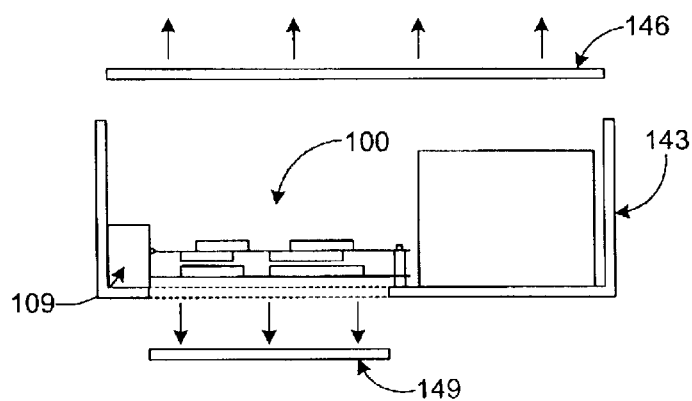

Beginning with FIG. 4A, an apparatus is provided such as, for example, a computer system or server with a housing 143 that encloses the circuit board support arrangement 100. Thereafter, as shown in FIG. 4B, an access panel 146 of the housing is opened or removed as is appropriate. The access panel 146 may be, for example, removable, hinged or moored to the housing in some other manner. In addition, where circuit components reside on the underside of the first circuit board 103, an access panel 149 may be incorporated in the housing 143 to access the circuit components located thereon. The access panel 149 may be removable, hinged, or moored to the housing 143 in some other manner. Thus, to access the circuit components on the underside of the first circuit board 103, the access panel 149 is removed accordingly.

Figure 4C:
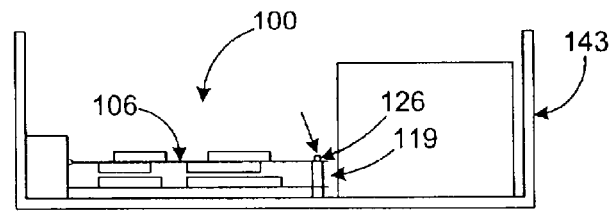
Figure 4D:
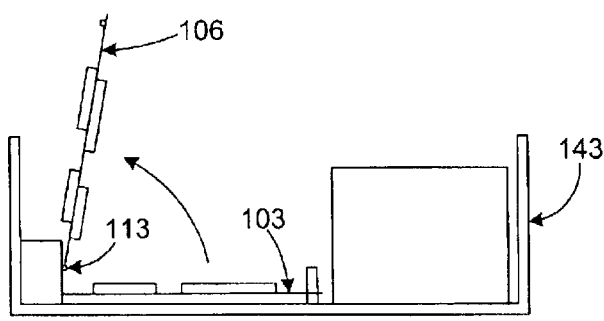
Figure 4E:
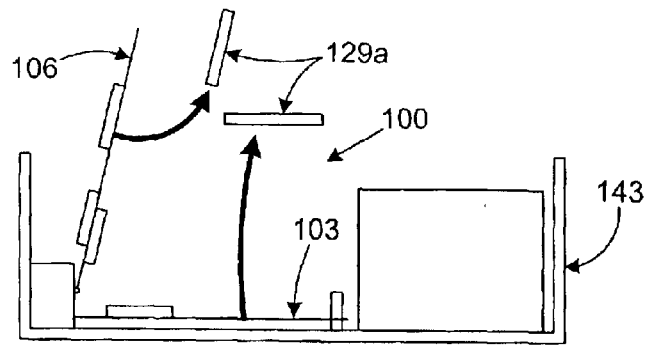
Figure 4F:
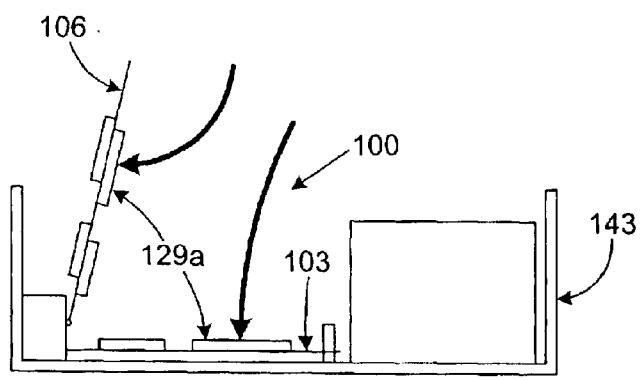
Figure 4G:
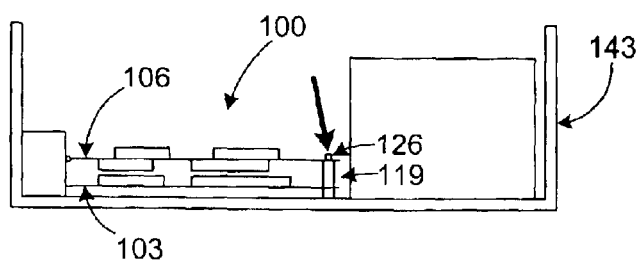
Figure 4H:
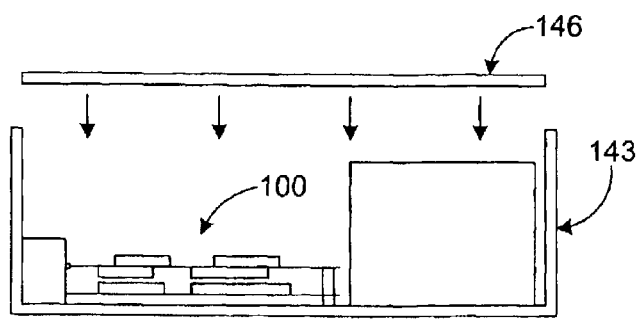

Next, in FIG. 4C, a free end of the second circuit board 106 is unfastened by loosening or removing the fasteners 126. Then, in FIG. 4D, the second circuit board 106 is pivoted about the pivot joint 113. Alternatively, the pivot joint 113 may be separated if desired where a releasable hinge or other similar device is employed as the pivot joint 113. In FIG. 4E a circuit component 129 such as a field replaceable unit 129a (FIG. 2) is removed from either the underside of the second circuit board 106 or from the exposed side of the first circuit board 103. Alternatively, circuit components 129 may be removed from both the underside of the second circuit board 106 and from the exposed side of the first circuit board 103. Then, as shown in FIG. 4F, replacement circuit components 129 are placed in the first and/or second circuit boards 103 and/or 106 as is appropriate. Thereafter, in FIG. 4G, the free end of the second circuit board 106 is fastened back to the board support 119. Finally, in FIG. 4H, the access panel 146 is closed or replaced, etc.

Although the invention is shown and described with respect to certain embodiments, the invention may be otherwise embodied and the appended claims are to be construed to cover the described embodiments and all alternative embodiments except to the extent limited by the prior art.

What is claimed is:

1. A circuit board support arrangement 4, comprising:
a first circuit board attached to a support structure;
a second circuit board attached to the support structure with a pivot joint, the second circuit board being juxtaposed over the first circuit board;
an electronic coupling attached between a first circuit on the first circuit board and a second circuit on the second circuit board, the electronic coupling being compatible with the pivot joint, wherein the electronic coupling further comprises a flexible cable; and
wherein the pivot joint has a weight bearing capacity at least as great as a weight of the second circuit board.

2. The circuit board support arrangement of claim 1, wherein the pivot joint further comprises at least one hinge.

3. The circuit board support arrangement of claim 1, wherein the second circuit board further comprises a number of circuit components mounted on both a first side and a second side of the second circuit board.

4. A circuit board support arrangement, comprising:
a first circuit board attached to a support structure, the first circuit board having a first circuit;
a second circuit board attached to the support structure with a pivot joint, the second circuit board being juxtaposed over the first circuit board, the second circuit board having a second circuit comprising a number of circuit components mounted on both a first side and a second side of the second circuit board; and
an electronic coupling attached between the first circuit on the first circuit board and the second circuit on the second circuit board, the electronic coupling being compatible with the pivot joint, wherein at least one of the circuit components is a field replaceable unit that can be replaced while the first circuit and the second circuit are operational.

5. A circuit board support arrangement comprising:
a first circuit board attached to a support structure;
a second circuit board attached to the support structure with a pivot joint, the second circuit board being juxtaposed over the first circuit board; and
an electronic coupling attached between a first circuit on the first circuit board and a second circuit on the second circuit board, the electronic coupling being compatible with the pivot joint, wherein the electronic coupling further comprises a flexible cable, wherein the pivot joint attaches a first end of the second circuit board to the support structure, and a free end of the second circuit board is detachably fastened to a board support.

6. The circuit board support arrangement of claim 5, wherein the board support further comprises at least one spacer.

7. The circuit board support arrangement of claim 5, wherein the board support further comprises the support structure.

8. The circuit board support arrangement of claim 5, wherein the free end of the second circuit board is detachably fastened to the board support with a fastener.

9. A circuit board support arrangement, comprising:
a first circuit board attached to a support structure;
a second circuit board juxtaposed over the first circuit board;
pivot means for pivotally attaching a first end of the second circuit board to the support structure;
means for facilitating electronic communications between a first circuit mounted on the first circuit board and a second circuit mounted on the second circuit board, wherein the first and second circuits each comprise a number of circuit components; and
wherein at least one of the circuit components is a field replaceable unit that can be replaced while the first and second circuits are operational.

10. A circuit board support method, comprising:
attaching a first circuit board to a support structure;
attaching a first end of a second circuit board to the support structure with a pivot joint, the second circuit board being juxtaposed over the first circuit board;
detachably fastening a free end of the second circuit board to a board support; and
electrically coupling a first circuit mounted on the first circuit board with a second circuit mounted on the second circuit board using a flexible cable.

11. The circuit board support method of claim 10, further comprising mounting at least one field replaceable unit on one of a first side and a second side of the second circuit board, is a field replaceable unit that can be replaced while the first circuit and the second circuit are operational.

12. A method of replacing a circuit component in a circuit in a circuit board support arrangement having a first circuit board and a second circuit board, comprising:

unfastening a free end of the second circuit board;

pivoting the second circuit board about a pivot joint away from the first circuit board;

replacing one of a number of circuit components located in the circuit, the circuit comprising a first circuit on the first circuit board and a second circuit on the second circuit board;

fastening the free end of the second circuit board; and maintaining the first circuit and the second circuit in an operational state while performing the steps of unfastening, pivoting, replacing, and fastening.

13. The method of claim 12, wherein the replacing of the circuit component further comprises:

removing the circuit component from an underside of the second circuit board; and installing a replacement circuit component onto the underside of the second circuit board.

14. The method of claim 12, wherein the replacing of the circuit component further comprises:

removing the circuit component from the first circuit board; and installing a replacement circuit component onto the first circuit board.

15. The method of claim 12, further comprising separating the pivot joint, thereby separating the second circuit board from a support structure.

16. The method of claim 12, further comprising:

opening an access panel of a device that houses the circuit board support arrangement before performing the steps of unfastening, pivoting, replacing, and fastening; and closing the access panel after performing the steps of unfastening, pivoting, replacing, and fastening.

* * * * *